United States Patent [19]

Horigome et al.

[11] Patent Number: 5,087,552
[45] Date of Patent: Feb. 11, 1992

[54] PHOTOSENSITIVE RESIN COMPOSITION

[75] Inventors: Tomoki Horigome, New York, N.Y.; Kenji Tazawa; Toshimi Aoyama, both of Kanagawa, Japan

[73] Assignee: Tokyo Ohka Kogyo Co., Ltd., Kanagawa, Japan

[21] Appl. No.: 420,961

[22] Filed: Oct. 13, 1989

[30] Foreign Application Priority Data

Oct. 19, 1988 [JP] Japan .................. 63-261436

[51] Int. Cl.$^5$ ............... G03F 7/004; G03F 7/038
[52] U.S. Cl. .................. 430/280; 430/285; 522/149; 522/121; 522/102; 522/42; 522/44
[58] Field of Search ............ 522/149, 121, 102, 42, 522/44; 430/280, 285, 283

[56] References Cited

U.S. PATENT DOCUMENTS

| | | | |
|---|---|---|---|
| 3,677,755 | 7/1972 | Fukui et al. | 430/285 |
| 3,773,547 | 11/1973 | Spoor et al. | 522/121 |
| 3,796,578 | 3/1974 | Hosoi et al. | 522/149 |
| 3,912,670 | 10/1975 | Huemmer et al. | 522/77 |
| 3,974,129 | 8/1976 | De La Mare | 522/149 |
| 4,009,195 | 2/1977 | Lesster et al. | 560/192 |
| 4,025,548 | 5/1977 | Huemmer et al. | 525/530 |
| 4,167,415 | 9/1979 | Higuchi et al. | 522/121 |
| 4,183,796 | 1/1980 | Ansel et al. | 522/96 |
| 4,370,403 | 1/1983 | Takaki | 522/121 |
| 4,537,855 | 8/1985 | Ide | 430/285 |
| 4,684,601 | 8/1987 | Nakamura et al. | 430/285 |
| 4,722,947 | 2/1988 | Thanawalla et al. | 522/120 |
| 4,745,138 | 5/1988 | Thanawalla et al. | 522/120 |

FOREIGN PATENT DOCUMENTS

| | | |
|---|---|---|
| 58-199341 | 11/1983 | Japan . |
| 59-218821 | 12/1984 | Japan . |
| 60-208377 | 10/1985 | Japan . |
| 62-119751 | 6/1987 | Japan . |
| 62-180541 | 8/1987 | Japan . |

Primary Examiner—Marion E. McCamish
Assistant Examiner—C. D. RoDee
Attorney, Agent, or Firm—Pennie & Edmonds

[57] ABSTRACT

The invention provides a photosensitive resin composition useful as a solder resist, etching resist or plating resist in the manufacture of printed circuit boards to exhibit excellent resistance against heat and chemicals and good adhesion to the substrate surface. The composition essentially comprises (a) a copolymeric resin of an $\alpha,\beta$-unsaturated dicarboxylic acid anhydride and an ethylenically unsaturated polymerizable compound, of which the acid anhydride units are partially esterified with an unsaturated alcohol and a saturated alcohol, and (b) a photopolymerization initiator. The composition may further comprise optional ingredients such as (c) a photopolymerizable monomeric compound, (d) an epoxy-based resin and (e) an aromatic diamine compound.

23 Claims, No Drawings

PHOTOSENSITIVE RESIN COMPOSITION

BACKGROUND OF THE INVENTION

The present invention relates to a photosensitive resin composition. More particularly, the invention relates to a photo-sensitive resin composition having high sensitivity and capable of exhibiting excellent heat resistance and adhesion to the substrate surface when used as a solder resist, etching resist or plating resist.

It is well known in the prior art that a photosensitive resin is used as a solder resist, etching resist or plating resist in the manufacturing process of printed circuit boards.

For example, Japanese Patent Kokai 60-208377 discloses a solder resist composition comprising a phenol novolac-type epoxy resin or cresol novolac-type epoxy resin having ethylenically unsaturated groups, photopolymerization initiator and amine-based curing agent for the epoxy resin. Further, Japanese Patent Kokai 58-199341 discloses a heat-resistant photosensitive resin composition comprising a diallyl phthalate prepolymer, photopolymerizable monomeric compound and photopolymerization initiator.

Though excellent in respect of the resistance against heat and chemicals, these prior art photosensitive resin compositions have a defect that the resist pattern formed of the composition can be developed only by using a specific organic solvent as the developer, which is sometimes very expensive, to cause a great economical disadvantage.

It is a trend in recent years from the standpoint of prevention of environmental pollution and adverse influences on the workers' health to abolish use of chlorine-containing organic solvents in particular so that the organic solvents usable in the development treatment of resist patterns are more and more limited.

With an object to overcome the above mentioned problems, development works are under way for a photosensitive resin composition developable by using water or an aqueous alkaline solution. Unfortunately, none of such water- or alkali-developable photosensitive resin compositions hitherto developed is satisfactory in practical applications due to the poor storage stability of the composition as well as poor resistance against heat and chemicals and adhesion to the substrate surface of the resist layer formed therefrom.

As a general problem of photosensitive resin compositions, the manufacturing cost of a practically useful resin composition is unavoidably high when the composition is formulated with a variety of ingredients while a photosensitive resin composition having high sensitivity and excellent heat resistance can be obtained only by formulating the composition with a number of ingredients each of which is expected to contribute in its own part to the performance of the resin composition.

SUMMARY OF THE INVENTION

The present invention accordingly has an object to provide a novel and improved photosensitive resin composition capable of being developed by using an aqueous alkaline solution as the developer to give a resist pattern having excellent resistance against heat and chemicals, electric insulation and adhesion to the substrate surface without the above described problems and disadvantages in the prior art compositions of the similar type.

Thus, the photosensitive resin composition of the present invention comprises, as a uniform mixture or in the form of a solution:

(a) a copolymeric resin of an $\alpha,\beta$-unsaturated dicarboxylic acid anhydride and an ethylenically unsaturated polymerizable compound, of which the moiety of the acid anhydride is partially esterified by the esterification reaction with an unsaturated alcohol and a saturated alcohol; and (b) a photopolymerization initiator.

In addition to the above defined components (a) and (b) as the essential ingredients, the composition may further comprise:

(c) a photopolymerizable monomeric compound;

(d) an epoxy-based resin which is a phenol novolac-type epoxy resin, cresol novolac-type epoxy resin, bisphenol novolac-type epoxy resin or a partially esterified resin obtained by the reaction of the above mentioned epoxy resin with an ethylenically unsaturated carboxylic acid; and/or (e) an aromatic diamine compound.

DETAILED DESCRIPTION OF THE PREFERRED EMBODIMENTS

As is described above, the most characteristic essential ingredient in the inventive photosensitive resin composition is the component (a) which is a copolymeric resin of an $\alpha,\beta$-unsaturated dicarboxylic acid anhydride and an ethylenically unsaturated polymerizable compound, of which the moiety of the acid anhydride is partially esterified by the esterification reaction with an unsaturated alcohol and a saturated alcohol.

The $\alpha,\beta$-unsaturated dicarboxylic acid anhydride from which the above mentioned copolymeric resin is prepared is exemplified by maleic anhydride, citraconic anhydride, 2-chloromaleic acid anhydride and the like though not particularly limitative thereto. These dicarboxylic acid anhydride can be used either singly or as a combination of two kinds or more according to need.

The ethylenically unsaturated polymerizable compound to be copolymerized with the above defined $\alpha,\beta$-unsaturated dicarboxylic acid anhydride is exemplified by styrene, 2-methyl styrene, esters of acrylic and methacrylic acids, vinyl acetate, acrylonitrile, vinyl chloride and the like though not particularly limitative thereto. These monomeric compounds can be used either singly or as a combination of two kinds or more. Among the above named monomeric compounds, styrene is particularly preferable in view of the high heat resistance of the copolymer prepared therefrom.

The above described $\alpha,\beta$-unsaturated dicarboxylic acid anhydride and the ethylenically unsaturated polymerizable compound are copolymerized in a molar copolymerization ratio in the range from 1:1 to 1:3. When the molar proportion of the latter comonomer is too large, the developability of the photosensitive resin composition is decreased and the resist layer after exposure to light may have somewhat decreased strengths. When the molar proportion thereof is too small, on the other hand, the resist pattern cannot be imparted with full heat resistance.

The unsaturated alcohol used in the esterification reaction of the copolymer from the $\alpha,\beta$-unsaturated dicarboxylic acid anhydride and the ethylenically unsaturated polymerizable compound is exemplified by allyl alcohol, 2-hydroxyethyl methacrylate, 2-hydroxypropyl acrylate, 2-hydroxypropyl methacrylate and the like though not particularly limitative thereto. These unsaturated alcohols can be used either singly or as a combination of two kinds or more according to need.

The saturated alcohol used also in the esterification reaction of the copolymer is exemplified by propyl alcohol, butyl alcohol, hexyl alcohol, octyl alcohol, 2,3-dichloropropyl alcohol, 2,3-dibromopropyl alcohol and the like though not particularly limitative thereto. These saturated alcohols can be used either singly or as a combination of two kinds or more according to need.

The degree of esterification of the copolymer can be varied according to the intended application of the photosensitive resin composition by appropriately selecting the reacting proportion of the unsaturated and saturated alcohols and the copolymer of the $\alpha,\beta$-unsaturated dicarboxylic acid anhydride and the ethylenically unsaturated polymerizable compound. Preferably, the esterification reaction is performed by using from 0.1 to 1:7 equivalents of the unsaturated and saturated alcohols as a total per equivalent of the acid anhydride moiety in the copolymer. When the amount of the reacted alcohols is too small, no resist pattern can be formed by development of the resist layer due to the loss of the resistance thereof against the developer solution. When the amount thereof is too large, on the other hand, the resist layer cannot be developed with an aqueous alkaline solution as the developer.

The proportion of the unsaturated alcohol and the saturated alcohol is also not limitative depending on the intended application of the composition. A preferable range of the unsaturated alcohol to the saturated alcohol is from 1:1 to 1:5 by moles.

The component (a) in the inventive composition is a partial esterification product of the copolymer of the $\alpha,\beta$-unsaturated dicarboxylic acid anhydride and the ethylenically unsaturated polymerizable compound in which a part of the acid anhydride units are converted into ester groups with the unsaturated alcohol so that the copolymeric resin can be polymerized and cured by irradiation with actinic rays or by heating to be imparted with increased heat resistance. Further, the copolymeric resin as the component (a) has carboxyl groups so that it is soluble in an aqueous alkaline solution.

The photopolymerization initiator as the component (b) in the inventive composition is exemplified by benzophenone compounds such as benzophenone, 4,4'-dimethylamino benzophenone, 4,4'-diethylamino benzophenone and the like, anthraquinone compounds such as 2-ethyl anthraquinone, tert-butyl anthraquinone and the like, benzoin alkyl ethers such as benzoin ethyl ether, benzoin isopropyl ether and the like, 2,2-dimethoxy-2-phenyl acetophenone, 2,2-diethoxy acetophenone, 2-chloro thioxanthone, diethyl thioxanthone, 2-hydroxy-2-methyl propiophenone, 4'-isopropyl-2-hydroxy-2-methyl propiophenone, 2-methyl-[4-(methylthio) phenyl]-2-morpholino-1-propanone and so on. These compounds can be used either singly or as a combination of two kinds or more according to need as the component (b) in an amount in the range from 0.1 to 25 parts by weight per 100 parts by weight of the copolymeric resin as the component (a).

The photosensitive resin composition of the invention may contain a photopolymerizable monomeric compound as the component (c) in addition to the above described components (a) and (b) when improvement is desired in the photosensitivity and resistance against developer solutions. Examples of suitable photopolymerizable monomeric compounds include 1,6-hexanediol diacrylate, trimethylol propane triacrylate, trimethylol propane trimethacrylate, trimethylol propane diacrylate, trimethylol propane dimethacrylate, tetramethylol methane triacrylate, tetramethylol methane trimethacrylate, tetramethylol propane tetraacrylate, tetramethylol propane tetramethacrylate, dipentaerithritol pentaacrylate, dipentaerithritol pentamethacrylate, tri(acryloxypropoxypropoxymethyl) propane and the like though not particularly limitative thereto. When added, the amount of these photopolymerizable monomeric compounds in the inventive composition should be in the range from 1 to 50 parts by weight per 100 parts by weight of the copolymeric resin as the component (a). An excessively large amount of the photopolymerizable monomeric compound in the composition is undesirable because the resist layer formed from the composition may have increased surface tackiness and the resolving power of the resist layer in patterning may be adversely affected.

In addition to the above described photopolymerizable monomeric compound, the inventive photosensitive resin composition may contain an epoxy resin as a further optional ingredient, i.e. component (d). Addition of an epoxy resin is effective to greatly improve the heat resistance of the resist layer formed from the composition. Examples of suitable epoxy resin include phenol novolac-type and cresol novolac-type epoxy resins obtained by the reaction of epichlorohydrin or methyl epichlorohydrin with a phenol or cresol novolac resin prepared from phenol or cresol and formaldehyde. Such an epoxy resin can react with the copolymeric resin as the component (a) when the composition is heated to increase the polymerization density. Besides the above mentioned epoxy resins per se, useful epoxy resins include those partially esterified epoxy resins obtained by the esterification reaction of the above mentioned epoxy resin with an ethylenically unsaturated carboxylic acid in an amount in the range from 0.2 to 0.8 equivalent per equivalent of the epoxy groups in the phenol novolac-type or cresol novolactype epoxy resin.

Examples of the above mentioned ethylenically unsaturated carboxylic acid to be reacted with the epoxy resin include acrylic acid, methacrylic acid, crotonic acid, monomethyl maleate, monopropyl maleate, monobutyl maleate, sorbic acid and the like though not particularly limitative thereto. These unsaturated carboxylic acids can be used either singly or as a combination of two kinds or more according to need.

The partially esterified epoxy resin has photopolymerizable ethylenically unsaturated groups and epoxy groups in the molecular structure so that the resin is susceptible to both of photopolymerization by the irradiation with ultraviolet light and thermal polymerization by heating.

The esterification reaction of the epoxy resin with the ethylenically unsaturated carboxylic acid can be promoted by a conventional esterification catalyst including secondary and tertiary amines and salt thereof such as diethyl amine hydrochloride, diethyl amine acetate, triethyl amine and the like.

Admixture of the above mentioned epoxy resin or partially esterified epoxy resin with the inventive composition is effective to improve not only the heat resistance but also the resistance against solvents and chemicals and electric insulation of the resist layer formed from the composition. The amount of the epoxy resin or partially esterified epoxy resin in the inventive composition, when added, is in the range from 1 to 200 parts by weight per 100 parts by weight of the copolymeric resin as the component (a).

It is further optional that the inventive photosensitive resin composition is admixed with an aromatic diamine compound which is effective to promote the curing reaction of the copolymeric resin as the component (a) by heating so that the resist layer formed from the inventive composition may be imparted with further improved thermal stability and resistance against acids after curing by heating. Furthermore, the aromatic diamine compound acts as a curing agent of epoxy resins when the inventive photosensitive resin composition contains the epoxy resin or partially esterified epoxy resin.

Examples of suitable aromatic diamine compound as the component (e) in the inventive composition include phenylene diamine, 4,4'-methylene dianiline, benzidine, 4,4'-thiodianiline, dianisidine, diamino diphenyl ether, diamino diphenyl sulfone, 4,4'-bis(o-toluidine) and the like. These aromatic diamine compounds can be used either singly or as a combination of two kinds or more according to need. The amount of the aromatic diamine compound in the inventive composition, when added, is preferably in the range from 1 to 15 parts by weight per 100 parts by weight of the copolymeric resin as the component (a).

The inventive photosensitive resin composition can be admixed, if desired, with a finely divided particulate material in order to improve the inking behavior. Examples of suitable finely divided particulate material include inorganic ones such as fumed silica fillers, mica flakes, talc, aluminum oxide and the like and organic ones such as spherical particles of benzoguanidine, granules of polyimide resin, granules of polyamide resin and the like. The amount of the fine powder compounded with the inventive composition should naturally be varied depending on the kind of the powder and intended application of the composition. In a rough measure, the amount of the fine powder is, when used, in the range from 1 to 70% by weight based on the overall amount of the inventive composition excepting solvent.

In addition to the above described various optional additive ingredients, the inventive composition can be admixed with known additives conventionally used in photosensitive resin compositions including polymerization inhibitors such as hydroquinone, methyl hydroquinone, hydroquinone monomethyl ether and the like to prevent gelation or to improve storage stability, silicone-based or fluorocarbon-based defoaming agents, coloring agents, i.e. pigments and dyes, and so on according to need.

The inventive photosensitive resin composition is used usually in the form of a solution in an organic solvent. Examples of suitable organic solvent therefor include ether solvents such as ethylene glycol monomethyl ether, ethylene glycol monoethyl ether, ethylene glycol monobutyl ether, propylene glycol monomethyl ether, diethylene glycol monomethyl ether, dipropylene glycol monomethyl ether and the like and ketone solvents such as methyl ethyl ketone, methyl isobutyl ketone, cyclohexanone and the like. These organic solvents can be used either singly or as a mixture of two kinds or more according to need.

Following is a description of the application of the inventive photosensitive resin composition as a solder resist, plating resist or etching resist.

When the inventive photosensitive resin composition is used as a solder resist, the composition is applied to both surfaces of a printed circuit board having a through-hole and a circuit pattern formed thereon by using a suitable coating apparatus such as roller coater, curtain-flow coater and the like and dried followed by pattern-wise exposure to ultraviolet light through a negative photomask and development of the pattern by dissolving away the resin composition on the unexposed areas with a weakly alkaline aqueous solution of, for example, sodium carbonate. If necessary, the development treatment is followed by a heat treatment at 100° to 200° C. so that curing of the resin composition is completed to give a patterned solder resist layer.

When the inventive resin composition is used as a plating resist, the inventive resin composition is applied, for example, to both surfaces of a copper-foiled laminated plate by using a roller coater and the like and dried followed by pattern-wise exposure to light through a negative photomask and development treatment to form a patterned resist layer by dissolving away the resin composition on the unexposed areas with a weakly alkaline aqueous solution before the plating treatment. It is preferable that the plating treatment is conducted in a neutral or acidic plating bath.

When the inventive photosensitive resin composition is used as an etching resist, a patterned resist layer is formed on a copper-foiled laminated plate in a manner similar to above followed by the etching treatment to dissolve away the exposed copper foil by using a suitable etching solution such as an aqueous solution of iron (III) chloride and the like. The resist layer after completion of the etching treatment can readily be removed by dissolving away with a strongly alkaline aqueous solution such as an aqueous solution of sodium hydroxide and the like.

In the following, examples are given to illustrate the inventive photosensitive resin composition in more detail. In the following description, the term of "parts" always refers to "parts by weight".

EXAMPLE 1

Into a flask having a separable cover equipped with a stirrer, thermometer, reflux condenser and stopcocked water-discharge port were introduced 600 parts of toluene, 600 parts of a saturated alcohol adduct of a styrene-maleic anhydride copolymer in a molar copolymerization ratio of 1:1 with a degree of esterification of 35 to 50% (SMA 17352, a product by Arco Chemical Co.) as the component (a), 32 parts of allyl alcohol as an unsaturated alcohol and 0.6 part of p-toluene sulfonic acid as an esterification-dehydration catalyst and the mixture was heated at 110° C. for 10 hours to effect the dehydration esterification reaction.

After completion of the reaction, the reaction mixture was freed from toluene by distillation at 50° C. under a pressure of 20 mmHg and the residue was diluted by adding dipropylene glycol monomethyl ether acetate to give a solution of the copolymer having an average molecular weight of 5000 and an acid value of 230 containing 60% by weight of non-volatile matter. This solution is referred to as the copolymer solution A hereinbelow.

A photosensitive resin composition in the form of a uniform solution was prepared by thoroughly mixing, on a three-roller mill:

100 parts of the copolymer solution A;
5 parts of diethyl thioxanthone;

2 parts of 2,2-dimethoxy-2-phenyl acetophenone;

8 parts of a finely divided fumed silica filler (Aerosil 300, a product by Nippon Aerosil Co.); and 1 part of a silicone-based defoaming agent (a product by Shin-Etsu Chemical Co.).

The thus prepared resin composition was applied to a copper-foiled laminated plate by using a roller coater and dried by heating at 80° C. for 30 minutes. After cooling to room temperature, the surface of the coating layer of the resin composition was exposed pattern-wise to ultraviolet light through a negative photomask in a dose of 900 mJ/cm$^2$ and then developed to form a patterned resist layer by dissolving away the resin composition on the unexposed areas using a 1.0% by weight aqueous solution of sodium carbonate at 25° C. taking 100 seconds. The quality of the thus obtained patterned resist layer was quite satisfactory absolutely without lifting from the substrate surface or residual coating film left on the exposed areas after the development treatment.

EXAMPLE 2

A resin solution in a concentration of 60% by weight, which is referred to as the copolymer solution B hereinbelow, was prepared in just the same manner as in the preparation of the copolymer solution A in the preceding example, excepting replacement of the saturated alcohol adduct of a styrene-maleic anhydride copolymer (SMA 17352) with the same amount of a saturated alcohol adduct of a styrene-maleic anhydride copolymer of another grade in a molar copolymerization ratio of styrene: maleic anhydride of 1:1 with a degree of esterification of 35 to 50% (SMA 1440, a product by Arco Chemical Co.). The thus obtained copolymer had an acid value of 130 and average molecular weight of 7000.

Separately, 2000 parts of a cresol-type epoxy resin having a softening point of 60° to 70° C. and epoxy equivalent of 200 to 230 (YDCN 701, a product by Toto Kasei Kogyo Co.) were admixed with 288 parts of acrylic acid to give a molar ratio of 0.4 relative to the epoxy groups in the epoxy resin, 0.6 part of methyl hydroquinone and 2.9 parts of triethyl amine and the mixture was heated at 100° C. for 15 hours to effect the esterification reaction. The thus obtained resin, which is referred to as the esterified epoxy resin A hereinbelow, had an acid value of 2 or smaller.

A photosensitive resin composition in the form of a uniform solution was prepared by thoroughly mixing, on a three-roller mill:

100 parts of the copolymer solution B;
60 parts of the esterified epoxy resin A;
8 parts of trimethylol propane triacrylate;
6 parts of benzophenone;
2 parts of 4,4'-diethylamino benzophenone;
8 parts of a fumed silica filler (Aerosil 380, a product by Nippon Aerosil Co.); and
1.5 parts of the same silicone-based defoaming agent.

The thus prepared resin composition was applied to a printed circuit board having a circuit pattern formed thereon beforehand through a polyester fiber-made screen of 150 mesh fineness and dried by heating at 80° C. for 30 minutes. After cooling to room temperature, the coating layer of the resin composition was exposed pattern-wise to ultraviolet light in a dose of 600 mJ/cm$^2$ through a negative photomask and developed to form a patterned resist layer by dissolving away the resin composition on the unexposed areas using a 1.0% by weight aqueous solution of sodium carbonate at 35° C. taking 120 seconds followed by a heat treatment at 140° C. for 60 minutes to effect thermal curing of the resin composition.

The thus obtained printed circuit board having the patterned resist layer was immersed for 10 minutes in boiling ethylene glycol monoethyl ether and then for 60 minutes in a 5% by weight aqueous solution of sodium hydroxide at 60° C. without any noticeable changes in the appearance. Further, the printed circuit board was immersed for 30 seconds in a molten solder alloy at 260° C. and then subjected to the peeling test of the resist layer by using a pressure-sensitive adhesive tape to give a conclusion that the resist layer had excellent heat resistance and adhesion to the substrate surface.

EXAMPLE 3

A resin solution, which is referred to as the copolymer solution C hereinbelow, was prepared in just the same manner as in the preparation of the copolymer solution B in Example 2 excepting replacement of the allyl alcohol with 82 parts of 2-hydroxyethyl methacrylate as an unsaturated alcohol and the dipropylene glycol monomethyl ether acetate was replaced with ethylene glycol monomethyl ether acetate in an amount to give a concentration of 50% by weight in the copolymer solution C. The copolymeric resin in the solution had an acid value of 350 and an average molecular weight of 4500.

In the next place, a photosensitive resin composition in the form of a uniform solution was prepared by thoroughly mixing, on a three-roller mill:

100 parts of the copolymer solution C:
4 parts of diethyl thioxanthone;
6 parts of ethyl p-dimethylamino benzoate;
10 parts of trimethylol propane triacrylate;
8 parts of a fumed silica filler (Aerosil 200, a product by Nippon Aerosil Co.);
1 part of the same defoaming agent as used in Example 1; and
5 parts of 4,4'-diamino-3,3'-diethyl diphenyl methane.

The thus prepared resin composition was applied to a printed circuit board having a circuit pattern formed thereon beforehand through a polyester fiber-made screen of 150 mesh fineness and dried by heating at 80° C. for 20 minutes. After cooling to room temperature, the coating layer of the resin composition on the board was exposed pattern-wise to ultraviolet light in a dose of 700 mJ/cm$^2$ through a negative photomask and then developed by dissolving away the resin composition on the unexposed areas using a 1.5% by weight aqueous solution of sodium carbonate at 30° C. taking 100 seconds followed by a heat treatment at 160° C. for 60 minutes to effect thermal curing of the resin composition.

The printed circuit board having the thus formed patterned resist layer was immersed first in a 25% by weight sulfuric acid at 80° C. for 1 hour and then in a 10% by weight hydrochloric acid at 80 ° C. for 1 hour to find absolutely no noticeable changes in the appearance. Further, the printed circuit board was immersed for 30 seconds in a molten solder alloy at 260° C. and then subjected to a peeling test of the resist layer by using a pressure-sensitive adhesive tape to give a conclusion that the resist layer had excellent heat resistance and adhesion to the substrate surface.

EXAMPLE 4

A photosensitive resin composition in the form of a uniform solution was prepared by thoroughly mixing, on a three-roller mill:

100 parts of diethylene thioxanthone;
4 parts of diethylene thioxanthone;
6 parts of isoamyl p-dimethylamino benzoate; and
5 parts of trimethylol propane triacrylate.

The thus prepared resin composition was applied to a copperfoiled laminated plate through a polyester fiber-made screen of 150 mesh fineness and dried by heating at 80° C. for 30 minutes. After cooling to room temperature, the coating layer of the resin composition on the plate was exposed pattern-wise to ultraviolet light in a dose of 500 mJ/cm$^2$ through a negative photomask and then developed by dissolving away the resin composition on the unexposed areas using a 1.5% by weight aqueous solution of sodium carbonate at 30° C. taking 100 seconds.

The copper foil on the laminated plate exposed bare after the development treatment was subjected to an etching treatment by using an aqueous solution of iron (III) chloride. After completion of the etching treatment, the laminated plate was immersed in a 10% by weight aqueous solution of sodium hydroxide to dissolve away the resin composition on the copper foil. The thus prepared circuit pattern of copper foil had excellent fidelity to the pattern on the negative photomask.

COMPARATIVE EXAMPLE 1

A photosensitive resin composition in the form of a uniform solution was prepared by thoroughly mixing, on a three-roller mill:

100 parts of the saturated alcohol adduct of, a styrene-maleic anhydride copolymer (SMA 17352, see Example 1);
5 parts of diethyl thioxanthone;
2 parts of 2,2-dimethoxy-2-phenyl acetophenone;
8 parts of the same fumed silica filler as used in Example 2; 1 part of the same silicone-based defoaming agent as used in
Example 1; and
8 parts of trimethylol propane triacrylate.

The thus prepared resin composition was applied to a copper-foiled laminated plate through a polyester fiber-made screen of 150 mesh fineness and dried by heating at 80° C. for 20 minutes. After cooling to room temperature, the coating layer of the resin composition was exposed pattern-wise to ultraviolet light in a dose of 800 mJ/cm$^2$ through a negative photomask and then subjected to a development treatment by dissolving away the resin composition on the unexposed areas using a 1.5% by weight aqueous solution of sodium carbonate at 30° C. without success to give a patterned resist layer on the printed circuit board because of the whitening and swelling of the resist layer on the exposed areas.

COMPARATIVE EXAMPLE 2

A photosensitive resin composition in the form of a uniform solution was prepared by thoroughly mixing, on a three-roller mill:

100 parts of the same saturated alcohol adduct of a styrenemaleic anhydride copolymer as used in Example 2 (SMA 1440);
60 parts of the esterified epoxy resin A prepared in Example 2;
10 parts of trimethylol propane triacrylate;
4 parts of diethyl thioxanthone;
6 parts of ethyl p-dimethylamino benzoate;
8 parts of the same fumed silica filler as used in Example 1; and
2 parts of the same silicone-based defoaming agent as used in Example 1.

The thus prepared resin composition was applied to a printed circuit board having a circuit pattern formed thereon beforehand through a polyester fiber-made screen of 150 mesh fineness and dried by heating at 80° C. for 30 minutes. After cooling to room temperature, the coating layer of the resin composition was exposed pattern-wise to ultraviolet light in a dose of 600 mJ/cm$^2$ through a negative photomask and then developed by dissolving away the resin composition on the unexposed areas using a 1.0% by weight aqueous solution of sodium carbonate at 35° C. taking 120 seconds followed by a heat treatment at 140° C. for 60 minutes to effect thermal curing of the resin composition. The patterned resist layer thus formed on the printed circuit board was examined microscopically to find deep undercut and low sensitivity. The printed circuit board was immersed in a 5% by weight aqueous solution of sodium hydroxide at 60° C. for 30 minutes to find disappearance of the surface luster of the resist layer indicating that the resist layer had been attacked by the aqueous solution of sodium hydroxide. Further, the printed circuit board was immersed in a molten solder alloy at 260° C. for 30 seconds and then subjected to the peeling test by using a pressure-sensitive adhesive tape to find that a part of the resist layer was lifted from the substrate surface by the adhesive tape.

As is clearly demonstrated by the above given Examples and Comparative Examples, the photosensitive resin composition of the present invention has excellent resistance against heat and chemicals as well as good adhesion to the substrate surface when it is used as a solder resist, etching resist or plating resist in the manufacture of printed circuit boards along with a high economic advantage so that the resin composition is useful in the manufacture of highly reliable printed circuit boards.

What is claimed is:

1. A photosensitive resin composition which comprises, as a uniform mixture or in the form of a solution: (a) a copolymeric resin of an $\alpha$, $\beta$-unsaturated dicarboxylic acid anhydride and a first ethylenically unsaturated polymerizable compound, of which the moiety of the acid anhydride is partially esterified by an esterification reaction with a mixture of a saturated alcohol and a second ethylenically unsaturated compound comprising an unsaturated alcohol, wherein the moiety of the acid anhydride in the copolymeric resin is esterified with about 0.1 to 1.7 equivalents of the mixture of the unsaturated alcohol and the saturated alcohol as a total per equivalent of the acid anhydride units, wherein the molar ratio of the unsaturated alcohol to the saturated alcohol is in the range of 1:1 to 1:5, (b) a photopolymerization initiator; (c) a photopolymerizable monomeric compound; and (d) a partially esterified epoxy resin obtained by an esterification reaction of a phenol novolac epoxy resin or cresolnovalac epoxy resin with about 0.2 to 0.8 of an ethylenically unsaturated carboxylic acid per equivalent of the epoxy groups in the epoxy resin.

2. The photosensitive resin composition as claimed in claim 1 wherein the $\alpha,\beta$-unsaturated dicarboxylic acid anhydride is selected from the group consisting of maleic anhydride, citraconic anhydride and anhydride of 2-chloromaleic acid.

3. The photosensitive resin composition as claimed in claim 1 wherein the first ethylenically unsaturated polymerizable compound is selected from the group consisting of styrene, 2-methyl styrene, esters of acrylic acid, esters of methacrylic acid, vinyl acetate, acrylonitrile and vinyl chloride.

4. The photosensitive resin composition as claimed in claim 1 wherein the copolymerization ratio of the α,β-unsaturated dicarboxylic acid anhydride and the first ethylenically unsaturated polymerizable compound is in the range from 1:1 to 1:3 by moles.

5. The photosensitive resin composition as claimed in claim 1 wherein the saturated alcohol is selected from the group consisting of propyl alcohol, butyl alcohol, hexyl alcohol, octyl alcohol, 2,3-dichloropropyl alcohol and 2,3-dibromopropyl alcohol.

6. The photosensitive resin composition as claimed in claim 1 wherein the photopolymerization initiator is selected from the group consisting of benzophenone compounds, benzoin alkyl ethers, acetophenone compounds, thioxanthone compounds, propiophenone compounds and 2-methyl-2morpholino-1-propanone.

7. The photosensitive resin composition as claimed in claim 1 wherein the amount of the photopolymerization initiator as the component (b) is in the range from 0.1 to 25 parts by weight per 100 parts by weight of the component (a).

8. The photosensitive resin composition as claimed in claim 1 wherein the photopolymerizable monomeric compound is selected from the group consisting of 1,6-hexanediol diacrylate, trimethylol propane triacrylate, trimethylol propane trimethacrylate, trimethylol propane diacrylate, trimethylol propane dimethacrylate, tetramethylol methane triacrylate, tetramethylol methane trimethyacrylate, tetramethylol propane tetraacrylate, tetramethylol propane tetramethyacrylate, dipentaerithritol pentaacrylate, dipentaerithritol pentamethacrylate and tri(acryloxypropoxypropoxymethyl) propane.

9. The photosensitive resin composition as claimed in claim 1 wherein the amount of the photopolymerizable monomeric compound as the component (c) is in the range from 1 to 50 parts by weight per 100 parts by weight of the component (a).

10. The photosensitive resin composition as claimed in claim 1 wherein the ethylenically unsaturated carboxylic acid is selected from the group consisting of acrylic acid, methacrylic acid, crotonic acid, monomethyl maleate, monopropyl maleate, monobutyl maleate and sorbic acid.

11. The photosensitive resin composition as claimed in claim 1 wherein the amount of the epoxy-based resin as the component (d) is in the range from 1 to 200 parts by weight per 100 parts by weight of the component (a).

12. The photosensitive resin composition as claimed in claim 1 which further comprises a finely divided powder.

13. The photosensitive resin composition as claimed in claim 12 wherein the amount of the finely divided powder is in the range from 1 to 70% by weight based on the total amount of the components (a), (b), (c), and (d).

14. The photosensitive resin composition as claimed in claim 1 which is in the form of a solution in an organic solvent selected from the group consisting of ether solvents and ketone solvents.

15. The photosensitive resin composition as claimed in claim 14 wherein the organic solvent is an ether solvent selected from the group consisting of ethylene glycol monomethyl ether, ethylene glycol monoethyl ether, ethylene glycol monobutyl ether, propylene glycol monomethyl ether, diethylene glycol monomethyl ether and dipropylene glycol monomethyl ether.

16. The photosensitive resin composition as claimed in claim 1 wherein the α,β-unsaturated dicarboxylic acid anhydride is maleic anhydride, citraconic anhydride or an anhydride of 2-chloromaleic acid; the first ethylenically unsaturated polymerizable compound is styrene, 2-methyl styrene, an ester of acrylic acid, an ester of methyacrylic acid, vinyl acetate, acrylonitrile or vinyl chloride; the second ethylenically unsaturated alcohol is allyl alcohol, 2-hydroxy ethyl methacrylate, 2-hydroxy propyl acrylate or 2-hydroxypropyl methacrylate; the saturated alcohol is propyl alcohol, butyl alcohol, hexyl alcohol, octyl alcohol, 1,3-dichoropropyl alcohol or 2,3-dibromopropyl alcohol; the photopolymerizable monomeric compound is 1,6-hexanediol diacrylate, trimethylol propane diacrylate, trimethylol propane dimethyacrylate, tetramethylol methane triacrylate, tetramethylol methane trimethacrylate, tetramethylol propane tetraacrylate, tetramethylol propane tetramethacrylate, dipentaerithritol pentacrylate, dipentaerithritol pentamethacrylate or tri(acryloxypropoxymethyl) propane; and the epoxy-based resin is a phenolnovolac epoxy resin, a cresol-novolac epoxy resin or a partially esterified resin thereof.

17. The photosensitive resin composition as claimed in claim 16 wherein the copolymerization of the α,β-unsaturated dicarboxylic acid anhydride and the first ethylenically unsaturated polymerizable compound is in the range from 1:1 to 1:3 by moles and the molar ratio of the unsaturated alcohol to the saturated alcohol is in the range from 1:1 to 1.5.

18. The photosensitive resin composition as claimed in claim 17 which further comprises a finely divided powder in an amount in the range from 1 to 70% by weight based on the total amount of the components (a), (b), (c) and (d).

19. The photosensitive resin composition as claimed in claim 18 which is in the form of a solution in an organic solvent of ethylene glycol monomethyl ether, ethylene glycol monoethyl ether, ethylene glycol monobutyl ether, propylene glycol monomethyl ether, diethylene glycol monomethyl ether or dipropylene glycol monomethyl ether.

20. A photosensitive resin composition which comprises, as a uniform mixture or in the form of a solution: (a) a copolymeric resin of an α,β-unsaturated dicarboxylic acid anhydride and a first ethylenically unsaturated polymerizable compound, of which the moiety of the acid anhydride is partially esterified by a two step esterification reaction with a mixture of a saturated alcohol and a second ethylenically unsaturated compound comprising an unsaturated alcohol, wherein the moeity of the acid anhydride in the copolymeric resin is esterified with about 0.1 to 1.7 equivalents of the mixture of the unsaturated alcohol and the saturated alcohol, and wherein the molar ratio of the unsaturated alcohol to the saturated alcohol is in the range of 1:1 to 1:5; (b) a photopolymerization initiator; (c) a photopolymerizable monomer; (d) a partially esterified epoxy resin obtained by an esterification reaction of a phenol-novolac epoxy resin or cresol-novolac epoxy resin with about 0.2 to 0.8 equivalents of an ethylenically unsaturated carboxylic acid per equivalent of the epoxy groups in the epoxy resin; and in aromatic diamine compound.

21. The photosensitive resin composition as claimed in claim 20 wherein the aromatic diamine compound is selected from the group consisting of phenylene diamine, 4,4'-methylene dianiline, benzidine, 4,4'-thio dianiline, dianisidine, diamino diphenyl ether, diamino diphenyl sulfone and 4,4'-bis(o-toluidine).

22. The photosensitive resin composition as claimed in claim 20 wherein the amount of the aromatic diamine compound as the component (e) is in the range from 1 to 15 parts by weight per 100 parts by weight of the component (a).

23. The photosensitive resin composition as claimed in claim 20 wherein the ethylenically unsaturated carboxylic acid is acrylic acid, methacrylic acid, crotonic acid, monomethyl maleate, monopropyl maleate, monobutyl maleate or sorbic acid.

* * * * *